United States Patent
Wang (10) Patent No.: US 7,361,406 B2
(45) Date of Patent: Apr. 22, 2008

(54) ULTRA-HIGH CURRENT DENSITY THIN-FILM SI DIODE

(75) Inventor: Qi Wang, 8552 S. Miller Ct., Littleton, CO (US) 80127

(73) Assignee: Qi Wang, Littleton, CO (US)

( * ) Notice: Subject to any disclaimer, the term of this patent is extended or adjusted under 35 U.S.C. 154(b) by 254 days.

(21) Appl. No.: 10/488,902

(22) PCT Filed: Apr. 29, 2003

(86) PCT No.: PCT/US03/14386

§ 371 (c)(1),
(2), (4) Date: Mar. 4, 2004

(87) PCT Pub. No.: WO2004/100272

PCT Pub. Date: Nov. 18, 2004

(65) Prior Publication Data

US 2005/0129933 A1    Jun. 16, 2005

(51) Int. Cl.
*B32B 9/00*    (2006.01)
*B32B 17/06*    (2006.01)
*B32B 9/04*    (2006.01)
*C23C 8/00*    (2006.01)
*H01L 31/00*    (2006.01)

(52) U.S. Cl. .................. 428/446; 257/656; 428/336; 428/428; 428/448; 427/585

(58) Field of Classification Search ............... 257/656; 427/585; 428/336, 428, 446, 448
See application file for complete search history.

(56) References Cited

U.S. PATENT DOCUMENTS

| 3,818,365 | A | * | 6/1974 | Hanson ..................... 330/287 |
| 3,976,361 | A | | 8/1976 | Fraas et al. |
| 4,231,820 | A | | 11/1980 | Henry |
| 4,307,935 | A | * | 12/1981 | Monnier ..................... 385/88 |
| 4,412,900 | A | * | 11/1983 | Tanaka et al. ......... 204/192.26 |
| 4,528,082 | A | * | 7/1985 | Moustakas et al. .... 204/192.25 |
| 4,975,752 | A | | 12/1990 | Kashima et al. |
| 5,155,565 | A | | 10/1992 | Wenz et al. |
| 5,216,263 | A | | 6/1993 | Paoli |
| 5,317,170 | A | | 5/1994 | Paoli |
| 5,336,924 | A | | 8/1994 | Quint |
| 5,354,967 | A | * | 10/1994 | Barzilai et al. ............ 219/225 |
| 5,627,386 | A | | 5/1997 | Harvey et al. |
| 5,828,683 | A | | 10/1998 | Freitas |
| 6,051,874 | A | | 4/2000 | Masuda |
| 6,229,153 | B1 | | 5/2001 | Botez et al. |

* cited by examiner

*Primary Examiner*—Callie Shosho
*Assistant Examiner*—Jonathan Langman
(74) *Attorney, Agent, or Firm*—Lathrop & Gage LC (57) ABSTRACT

A combination of a thin-film µc-Si and a-Si:H containing diode structure characterized by an ultra-high current density that exceeds 1000 A/cm$^2$, comprising: a substrate; a bottom metal layer disposed on the substrate; an n-layer of µc-Si deposited the bottom metal layer; an i-layer of µc-Si deposited on the n-layer; a buffer layer of a-Si:H deposited on the i-layer, a p-layer of µc-Si deposited on the buffer layer; and a top metal layer deposited on the p-layer.

28 Claims, 7 Drawing Sheets

FIGURE 7 ined with the glow discharge process to investigate the effect of the barrier profile on the electrical properties of the diodes. The highest current densities, up to 40 A/cm² are obtained with n⁺-i-p⁺ structures.

ULTRA-HIGH CURRENT DENSITY THIN-FILM SI DIODE

CONTRACTUAL ORIGIN OF THE INVENTION

The United States Government has rights in this invention under Contract No. DE-AC3699GO10337 between the United States Department of Energy and the National Renewable Energy Laboratory, a division of the Midwest Research Institute.

TECHNICAL FIELD

The invention relates to ultra-high current density thin-film diodes and a process of making the same utilizing a hot-wire chemical vapor deposition (CVD) technique at low substrate temperatures. The current density produced exceeds 1000 A/cm², which is a record for thin film diodes. The diode is characterized by a good n-factor of about 1.8 and excellent rectification of over $10^7$ at ±1.5V. The ultra-high current density thin-film diode may be utilized in devices such as small area memory, imaging detectors, high-density displays, and other low cost and flexible substrate electronic applications such as plastics, as well as devices on paper.

The development of this ultra-high current density thin-film Si diode is simple and inexpensive and can be scaled up. It represents a significant advance in replacement of complicated and expensive thin film transistors that are currently pervasive in all thin film consumer devices, in that it directly addresses and significantly increases the density of the elements or pixels.

BACKGROUND ART

Thin film diodes are in widespread use, and in general, thin film manufacturing techniques are less expensive and produce higher yields than wafer scale processing techniques used to fabricate crystalline or "discrete" diodes. Nevertheless, known thin film diodes have characteristics which are poorly suited for many applications.

For example, the rigid substrates on which thin film diodes are fabricated prohibits their use in applications in which the device must be physically deformed. Further, contaminants from metallic contact layers frequently react with the semiconductor body during processing, and thereby degrades the diode's electrical characteristics. Since the diodes are typically used with other semiconductor devices, the diodes must be separately fabricated and interconnected.

U.S. Pat. No. 5,155,565 discloses an amorphous silicon thin film p-i-n solar cell and Schottky barrier diode on a common substrate, comprising:

a substrate;

a first conductive layer on the substrate;

an unseparated amorphous silicon ohmic contact layer over a solar cell portion and a diode portion on the first conductive layer;

one or more layers of amorphous silicon forming a diode body over the diode portion on the ohmic contact layer, including a layer of n-type silicon doped to a concentration of $10^{18}$ to $10^{20}$ atoms per cubic centimeter with an element from Group V on the periodic table;

at least two layers of amorphous silicon forming a p-i-n solar cell body in conjunction with the ohmic contact layer over the solar cell portion on the ohmic contact layer, adjacent to and spaced from the diode body to form a separation between the solar cell body and the diode body; insulating material within the separation between the diode body and solar cell body, the diode body and solar cell body electrically interconnected by the first conductive and ohmic contact layers; and a second conductive layer on the diode body and on the solar cell body, the diode body forming a Schottky barrier with the second conductive layer.

A high density, optically corrected, micro-channel cooled, V-groove monolithic laser diode array is disclosed in U.S. Pat. No. 5,828,683. The laser diode array comprises:

a substrate having an upper surface and a lower surface;

a plurality of v-grooves formed in the upper surface; a metalization layer formed on the upper surface and within the plurality of v-grooves;

a metalization break formed in each v-groove of the plurality of v-grooves; and a plurality of laser diode bars, wherein a single laser diode bar of the plurality of laser diode bars is placed within each v-groove of the plurality of v-grooves.

U.S. Pat. No. 6,229,153 B1 discloses a high peek current density resonant tunneling diode comprising:

a) a substrate of nominally exact (100)+/–0.5° GaAs;

b) a multilayer resonant tunneling diode structure grown on the (100) GaAs substrate, the resonant tunneling diode structure comprising a quantum well layer of low band-gap material between barrier layers of AlGaAs, and wherein the material of the quantum well layer is selected such that the second energy level of the quantum well layer is at or slightly above the conduction band edge in GaAs, the quantum well layer grown to be a strained layer with smooth interfaces with the barrier layers.

R. A. Gibson et al., in *RECENT DEVELOPMENTS IN AMORPOHOUS SILICON* p-n junction devices, Journal Of Non-Crystalline Solids, 35 & 36 (1900) 725-730 North-Holland Publishing Company, disclose amorphous Si p-n junctions with various doping profiles prepared by the glow discharge process to investigate the effect of the barrier profile on the electrical properties of the diodes. The highest current densities, up to 40 A/cm², is obtained with n⁺-i-p⁺ structures. Under AM-1 illumination, photovoltaic p⁺-i-n³⁰ cells generate open circuit voltages of 0.7V and short-circuit currents up to 10 mA/cm², corresponding to efficiencies between 3 and 4%. Diode quality factors are also investigated.

There is a need for a thin film diode that tolerates a high forward current density and is capable of many potential applications in consumer electronics, such as memory devices, photo-imaging detectors, and flat panel displays. The development of a simple and inexpensive ultra-high-current density thin-film Si diode would have a great impact for replacing the complicated and expensive thin film transistors that currently dominate all thin film consumer devices, and for significantly increasing the density of the elements or pixels in these consumer devices.

DISCLOSURE OF THE INVENTION

One object of the present invention is to provide a thin film diode that tolerates a high forward current density.

Another object of the present invention is to provide a thin film Si based diode with a forward current density of over 1000 A/cm², that is characterized by very good rectification of over 7 orders of magnitude at +/–1.5V.

A further object of the present invention is to provide a thin film Si based diode with a forward current density of over 1000 A/cm² wherein the diode has the simple structure of substrate/metal/n/i/b/p/metal, wherein the n—factor that quantifies the diode is about 1.8 and the turn-on voltage is less than 1V.

The thin film Si based diode is fabricated using a hot-wire chemical vapor deposition (HWCVD) technique. The diode formed has a simple structure of: substrate/metal/n/i/b/p metal. The process temperature range for fabricating this diode is from about 140° C. to about 160° C. for all layers, and this range is much lower than that of existing thin film diode processes. These lower processing temperatures enable the diode to be fabricated on a low cost substrate, such as plastic. During processing, a thin interface buffer layer is inserted between the i and p layers, and an Al top contact layer is formed using an e-beam or thermal deposition. The area of the diode formed is less than 1 mm$^2$. Further, the diode may also be fabricated using other structures, such as Schottky and p-i-n and plasma enhanced CVD techniques.

DETAILED DESCRIPTION OF PREFERRED EMBODIMENT OF THE INVENTION

Figure 1:
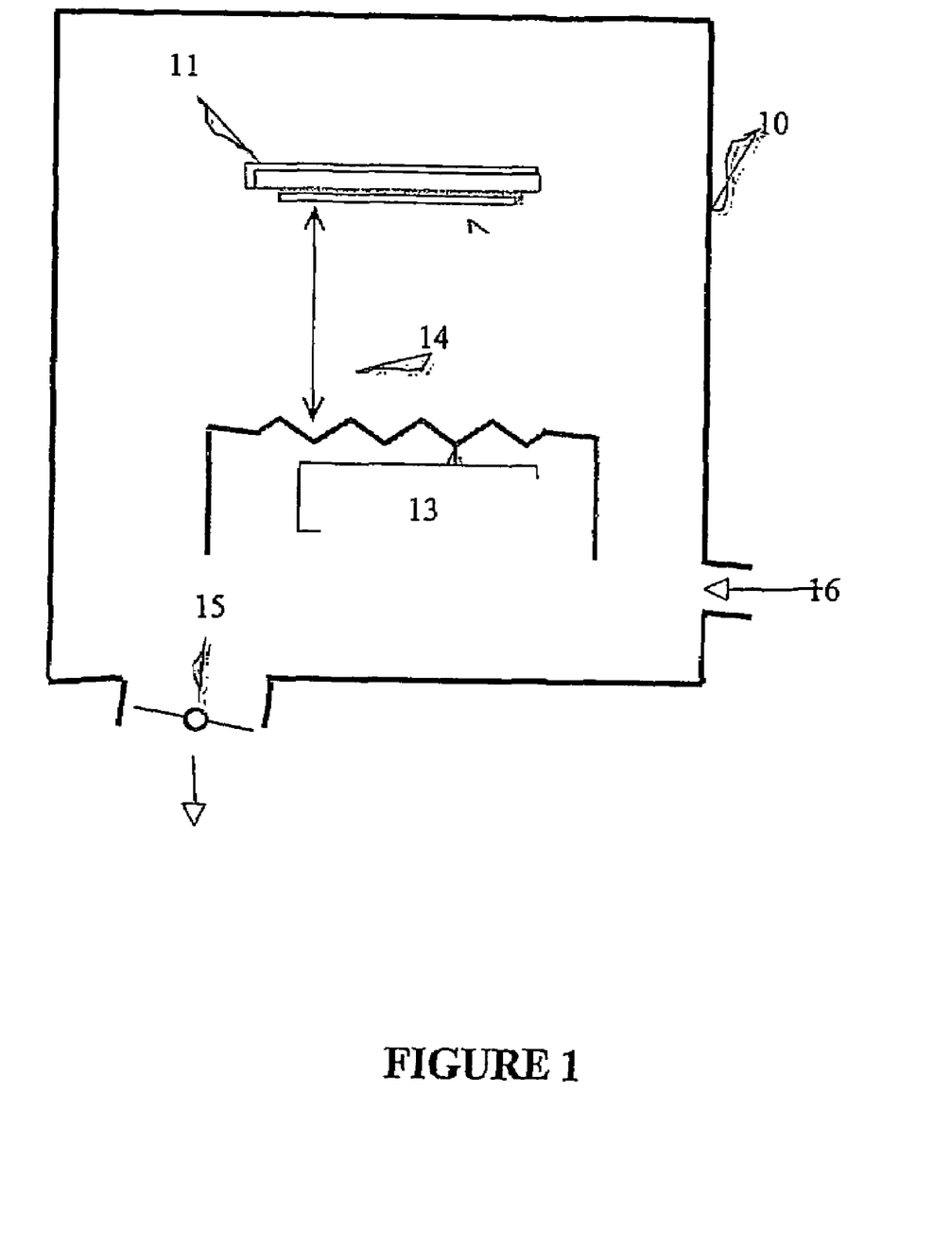
FIG. 1 shows the vacuum chamber configuration in which the ultra high current density thin film Si diode is produced using hot wire chemical vapor deposition (HWCVD).

Reference is now made to FIG. 1 which shows a vacuum chamber 10 in which a ultra high current density thin film Si diode is prepared by hot wire chemical vapor deposition. Basically, the vacuum chamber comprises a heater 11 for the substrate 12. A filament 13, preferably W, is heated to a temperature of about 2000° C. by passing an AC current at about 16 amps there through and this filament temperature is used for all of the hot wire layers. The filament for the spiral section of the W wire is preferably of a dimension of about 0.5 mm in diameter, the wire is coiled or spiraled in a 6 mm diameter, and the filament is about 6 cm long. The distance between the substrate and the W filament will range from about 4 to about 5 cm as depicted by the arrow 14. In general, the HWCVD procedure for preparing the ultra high current density thin film Si diode entails loading the metal coated substrate which has been deposited by e-beam into the HWCVD chamber 10; heating the substrate 12 to a temperature of between about 140° C. to about 160° C. and creating a vacuum utilizing a throttle valve 15 of the vacuum chamber to obtain a vacuum below about 10$^{-6}$ torr. Thereafter, the filament is turned on by passing an AC current of about 16 amps there through to provide a filament temperature of about 2000° C., and opening a gas inlet 16 having gas valves associated therewith, so that each gas valve is fixed at a pre-set flow rate for each layer as set forth in Table I below, which gives the HWCVD parameters for the high density device.

TABLE I

| Step | | | Deposition technique | Thickness (Å) | SiH$_4$ (sccm) | H$_2$ (sccm) | 5% PH$_3$ in H$_2$ (sccm) | 3.1% TMB in He (sccm) | Dep. Time (mn.) | Pressure (mTorr) |
|---|---|---|---|---|---|---|---|---|---|---|
| 1 | substrate | Glass | | | | | | | | |
| 2 | Bottom metal | Cr | e-beam | 1000 | | | | | | |
| 3 | n-layer | μc-Si | HWCVD | 200 | 3 | 45 | 3 | 0 | 1 | 22 |
| 4 | i-layer | μc-Si | HWCVD | 1500 | 10 | 36 | 0 | 0 | 3 | 20 |
| 5 | Buffer-layer | a-Si:H | HWCVD | 350 | 10 | 6 | 0 | 0 | 0.66 | 10 |
| 6 | p-layer | μc-Si | HWCVD | 400 | 3 | 27 | 0 | 6 | 2 | 22 |
| 7 | Top metal | Al, | e-beam | 700 | | | | | | |

Note: TMB is trimethylboron. A 160° C. substrate temperature and a 2000° C. W filament are used for all HW layers. A 0.5 mm in diameter spiral tungsten wire coiled in 6 mm in diameter and 6 cm long is used as the filament. The deposition procedure is: load the metal coated substrate into the HWCVD chamber; heat the substrate to 160° C. and pump down the vacuum to below 10$^{-6}$ torr; turn on the filament by passing an AC current to 16 A (this gives about a 2000° C. filament temperature) and opening each gas valve to the pre-setting flow rate listed in the above table for each layer. Each layer's deposition is sequential from step 3 to step 6 (see the table) with less than a 1 minute break between the layers. The total process time is less than 10 minutes. The depositions are layered sequentially as is shown in steps 1-7 of Table I. The μc represents microcrystals, as opposed to amorphous silicon, nano-crystalline silicon or polycrystalline silicon.

Figure 2:
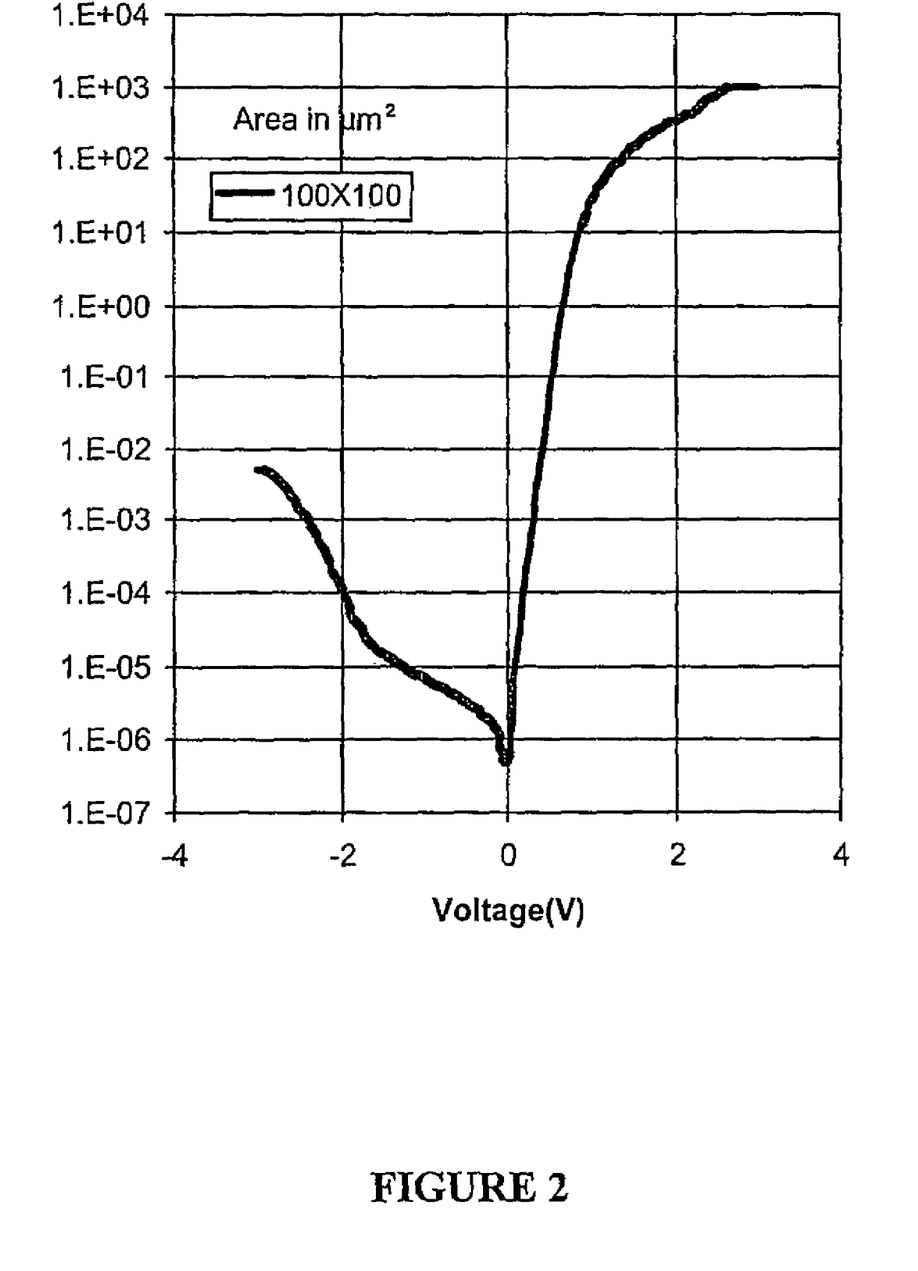
FIG. 2 is a graph showing current density (A/cm$^2$) versus voltage in a semi-log plot for a thin-film Si based diode with a forward current density of over 1000 A/cm$^2$.

In FIG. 2, a current density-voltage characteristic is shown for a thin-film Si-based diode with a forward current density of over 1000 A/cm². This number is 100 times better than the best published value to date. This diode not only has a high forward current density but also a very good rectification of over 7 orders of magnitude at +/−1.5V. Also, the n-factor that quantified the diode is about 1.8 and the turn-on voltage is less than 1V.

To achieve this ultra high-current density diode, it has been found that:

1. μc Si thin film based n-i-p diodes give a better current density and lower turn-on voltage than an a-Si:H based thin film diode;

2. The serial resistance including the probe contact at the front and back electrodes plays a key role in improving the current density; therefore, the smaller areas of diode with low current that pass through the diode and reduce serial resistance effect are key steps to improve the current density;

3. Since a-Si:H based diodes have a low reverse leakage current, it is clear that the high-rectified diode comes from the combination of an a-Si:H and μc-Si material;

4. The i-layer thickness is other key parameter to give high current density. In the end, space charge limit current (SCLC) will be the upper limit for the current. The thinner i-layer will increase the SCLC although the current of the diode is primarily limited by the serial resistance; and 5. Slightly P doped i-layer gives a high current. The i-layer in the diode is unintentionally light P doped from the contaminated chamber after the n-layer growth.

The J-V characteristics of the high current density diode of FIG. 2 is with the dimensions of 100 μm×100 μm. A size of a 10 μm×10 μm diode has been made to achieve 1000 Å/cm². Currently, the size is limited by the process.

Figure 3:
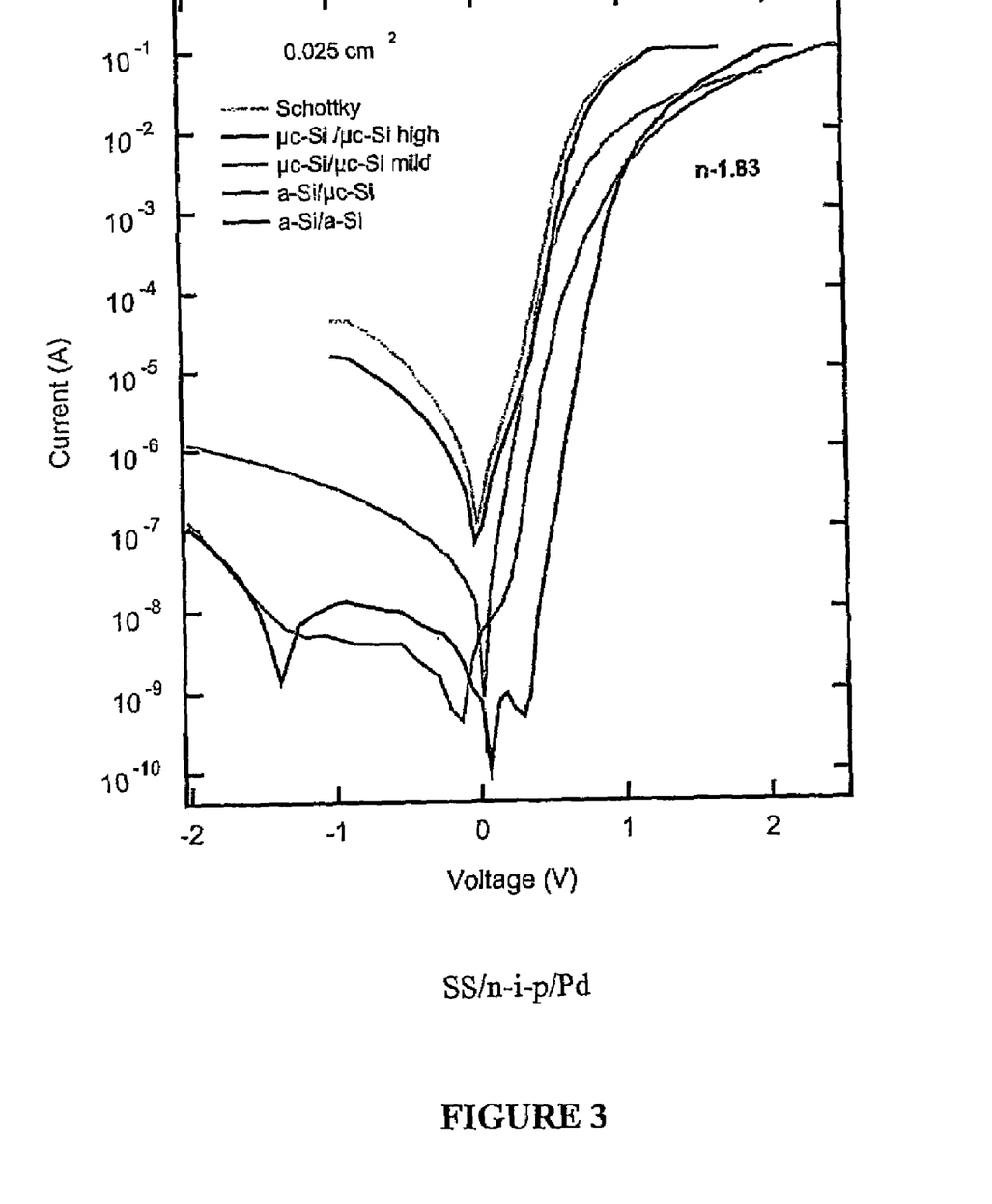
FIG. 3 is a graph depicting current density versus voltage in a semi-log plot for five different diode structures such as Schottky, combination of n/i of a-Si/a-Si, a-Si/μc-Si, mild μc-Si/μc-Si middle, and high μc-Si/μc-Si.

The current density versus voltage graph for FIG. 3 represents five different diode structures, wherein the basic diode is characterized by: SS/n-i-p/Pd with an area of 0.025 cm².

Figure 4:
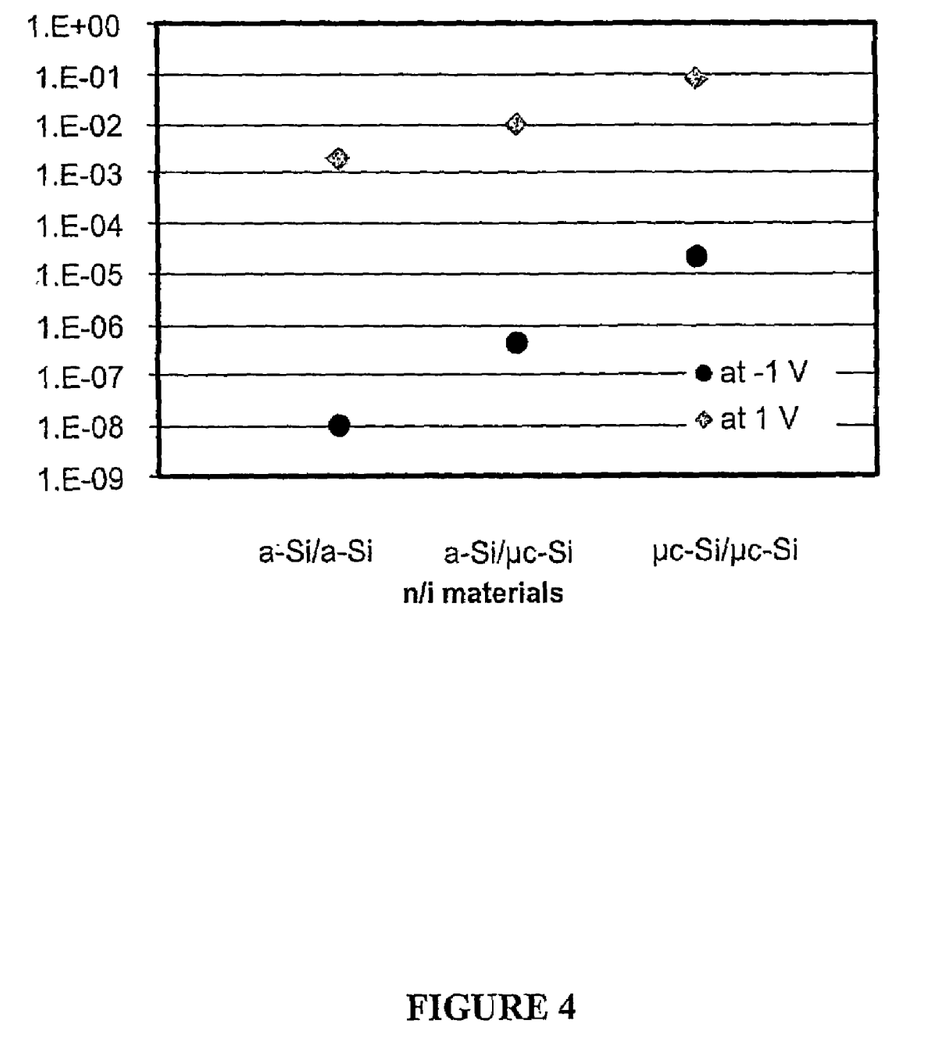
FIG. 4 is a graph depicting current density for structures comprising n/i layers of a-Si/a-Si, a-Si/μc-Si, and high μc-Si/μc-Si based diodes at −1V and +1V.

In the context of the invention, it can be seen from FIG. 4 that currents are provided for structures comprising n/i of a-Si/a-Si, a-Si/μc-Si, and highly μc-Si/μc-Si based diode at −1V and +1V. It is clear from FIG. 4 that all μc-Si diode structures give the highest current.

Figure 5:
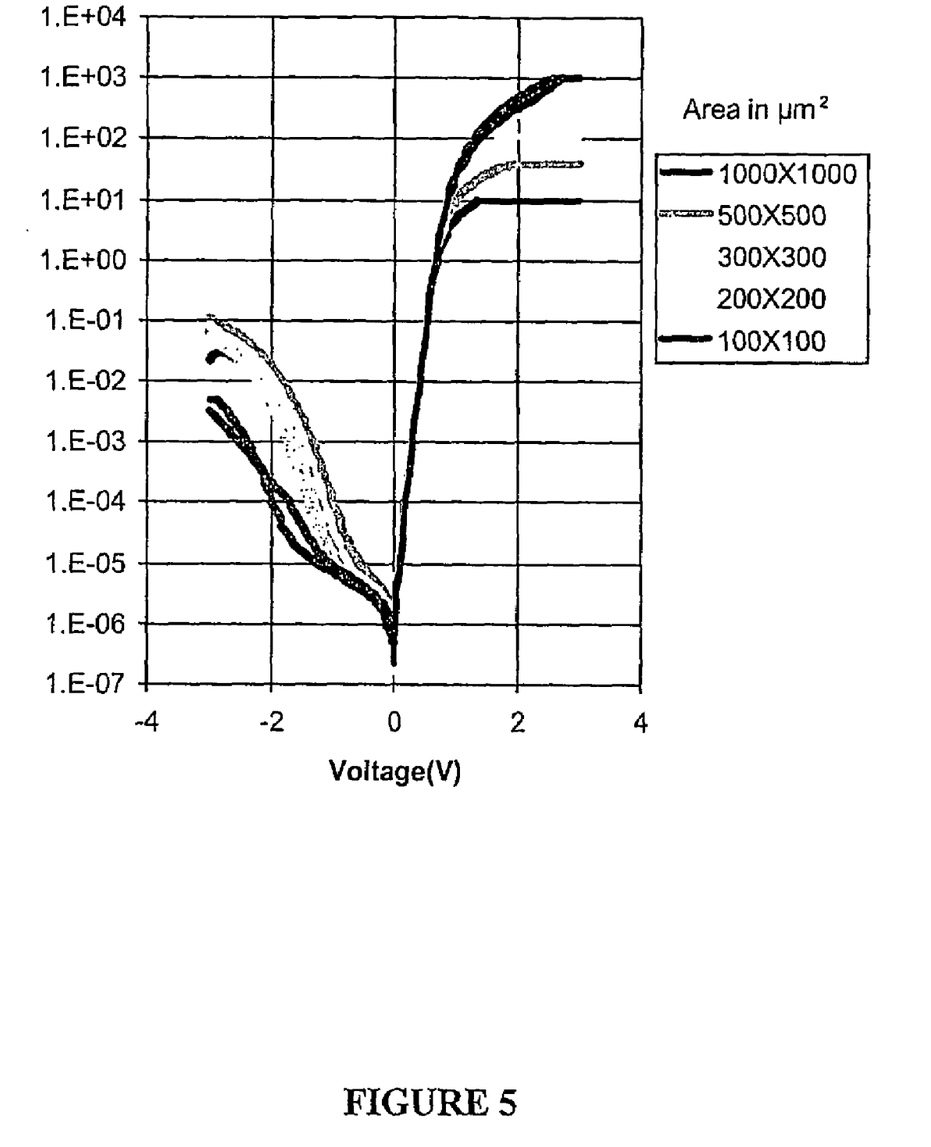
FIG. 5 is a graph depicting J (A/cm$^2$) versus voltage in a semi-log plot for various area ultra high density thin film μc-Si based diodes of the invention that were characterized by forward current densities, where J is repeatedly greater than 1000 A/cm$^2$. The size of the diodes is indicated in the figure.

FIG. 5 provides a graph wherein diodes of certain specifications set forth therein provide repeatable high J>1000 A/cm² diodes.

Figure 6:
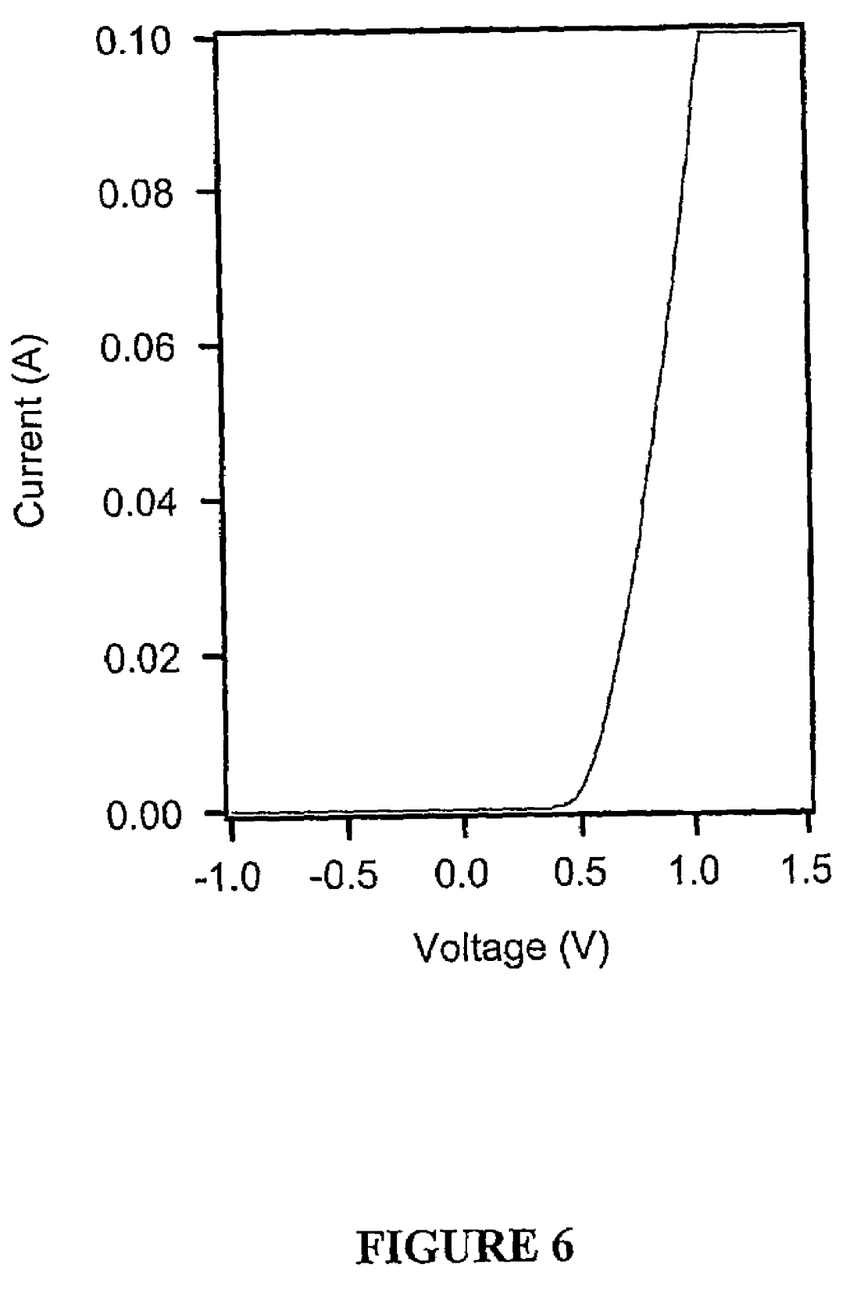
FIG. 6 is a graph showing current versus voltage in linear plot for a polymer substrate diode of the invention wherein the diode was successfully processed at about 140° C. for the polymer substrate.

The graph of FIG. 6 demonstrates that the invention process may be successfully carried out at a low temperature of about 140° C. The current versus voltage graph in linear plot is for a polymer substrate diode of the invention process conducted at 140° C.

Figure 7:
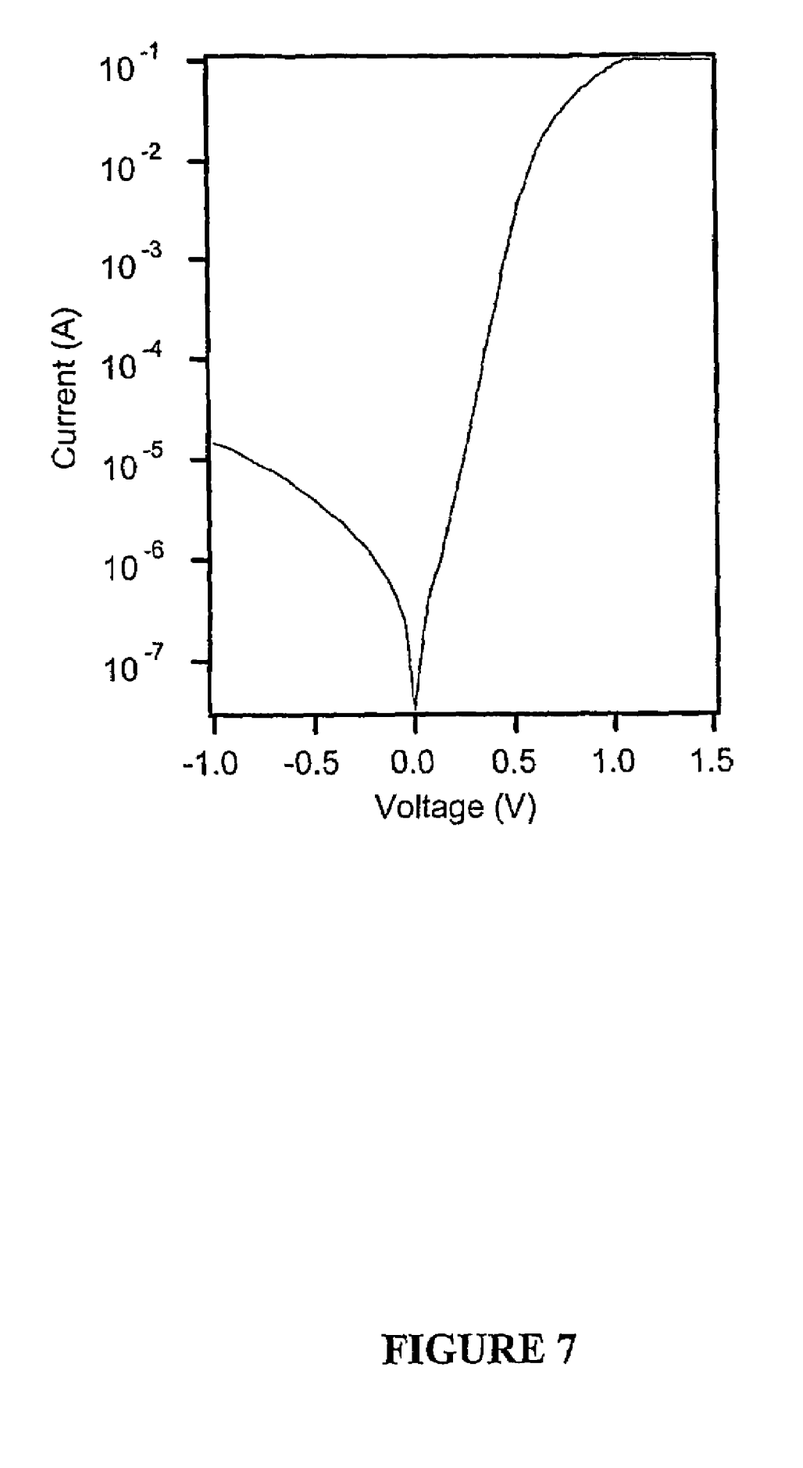
FIG. 7 is a graph depicting current versus voltage in a semi-log plot for a polymer substrate diode in which the n-factor quantified the diode at about n=1.6 and wherein the process temperature proceeded at about 140° C.

The graph showing current versus voltage in semi-log plot for a polymer substrate diode in FIG. 7 is one wherein the process temperature is carried out at 140° C. The n-factor quantified for the diode is at about n=1.6.

In the preferred embodiment of the invention, the ultra-high current density, thin-film Si based diode structure will be composed of the layers shown in Table II.

TABLE 2

| Structure | Materials |
| --- | --- |
| Metal | Al, Au, Pd. |
| p-layer | μc-Si 400 Å |
| b-layer | a-Si:H 350 Å |
| i-layer | μc-Si 1500 Å |
| n-layer | μc-Si 200 Å |
| metal | Cr, Ti, Pd, etc. |
| substrate | SS, glass, or polymer |

It is to be understood that the present invention is not limited to the embodiments disclosed herein, which are exemplary only, and encompasses all such forms thereof that come within the scope of the claims hereinafter set forth.

The invention claimed is:

1. A thin film diode structure characterized by an ultra-high current density that exceeds 1000 A/cm², said structure containing a combination wherein a buffer layer of an a-Si:H is interfaced between an i-layer of μc-Si and a p-layer of μc-Si, said thin film diode comprising:
    a) a substrate;
    b) a bottom metal layer disposed on said substrate;
    c) an n-layer of μc-Si deposited on said bottom metal layer;
    d) an i-layer of μc-Si deposited on said n layer;
    e) a buffer layer of a-Si:H deposited on said i layer;
    f) a p-layer of μc-Si deposited on said buffer layer; and
    g) a top metal layer deposited on said p layer.

2. The thin film diode structure of claim 1, wherein said substrate is selected from the group consisting of stainless steel, quartz, glass, a polymer, or paper.

3. The thin film diode structure of claim 2, wherein said polymer is a plastic.

4. The thin film diode structure of claim 3, wherein said plastic is selected from the group consisting of a polyimide or a polyester.

5. The thin film diode structure of claim 2, wherein said substrate is stainless steel.

6. The thin film diode structure of claim 2, wherein said substrate is quartz.

7. The thin film diode structure of claim 2, wherein said substrate is glass.

8. The thin film diode structure of claim 2, wherein said substrate is paper.

9. The thin film diode structure of claim 2, wherein said substrate is stainless steel and wherein said bottom metal layer in b) is selected from the group consisting of Cr, Ti or Pd.

10. The thin film diode structure of claim 9, wherein said n-layer in c) is a μc-Si of a thickness of about 200 Å.

11. The thin film diode structure of claim 10, wherein said i-layer in d) is a μc-Si of a thickness of about 1500 Å.

12. The thin film diode structure of claim 11, wherein said buffer layer in e) is an a-Si:H of a thickness of about 350 Å.

13. The thin film diode structure of claim 12, wherein said p-layer in f) is a μc-Si of a thickness of about 400 Å.

14. The thin film diode structure of claim 13, wherein said top metal layer in g) is selected from the group consisting of Al, Au or Pd.

15. A method of producing a combination thin film μc-Si and a-Si:H
    containing diode structure using hot wire chemical vapor deposition, and said structure being characterized by an ultra-high current density that exceeds 1000 A/cm², comprising:
    a) placing a substrate selected from the group consisting of stainless steel, quartz, glass, a polymer or paper in a vacuum chamber;
    b) depositing a bottom metal layer on said substrate disposed in a vacuum chamber using an e-beam;
    c) depositing an n-layer of μc-Si on said metal layer using hot wire chemical vapor deposition wider a vacuum of below about $10^{-6}$ torr;
    d) depositing an i-layer of μc-Si layer on the n-layer by hot wire chemical vapor deposition at a vacuum below about $10^{-6}$ torr;

e) depositing a buffer layer of a-Si:H on said i-layer by hot wire chemical vapor deposition at a vacuum pressure of below about $10^{-6}$ torr;

f) depositing a p-layer of μc-Si layer on said buffer layer by hot wire chemical vapor deposition at a vacuum pressure of below about $10^{-6}$ torr; and g) depositing a top metal layer on said p-layer by e-beam in the absence of a vacuum.

16. The method of claim 15 wherein said substrate is selected from the group consisting of stainless steel, quartz, glass, a polymer or paper.

17. The method of claim 16 wherein said polymer is a plastic.

18. The method of claim 17 wherein said plastic is selected from the group consisting of a polyimide or a polyester.

19. The method of claim 16, wherein said substrate is stainless steel.

20. The method of claim 16, wherein said substrate is quartz.

21. The method of claim 16, wherein said substrate is glass.

22. The method of claim 16, wherein said substrate is paper.

23. The method of claim 16 wherein said substrate is stainless. steel and wherein said bottom metal layer in step b) is selected from the group consisting of Cr, Ti or Pd.

24. The method of claim 23 wherein said n-layer in step c) is a μc-Si of a thickness of about 200 Å.

25. The method of claim 24 wherein said i-layer in step d) is a μc-Si of a thickness of about 1500 Å.

26. The method of claim 25 wherein said buffer layer in step e) is an a-Si:H of a thickness of about 350 Å.

27. The method of claim 26, wherein said p-layer in step f) is a μc-Si of a thickness of about 400 Å.

28. The method of claim 27 wherein said top metal layer in step g) is selected from the group consisting of Al, Au or Pd.

* * * * *